(12) United States Patent
Kim et al.

(10) Patent No.: US 6,906,970 B2
(45) Date of Patent: Jun. 14, 2005

(54) ADDRESS COUNTER STROBE TEST MODE DEVICE

(75) Inventors: In Soo Kim, Seoul (KR); Young Jun Nam, Gwangju (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 14 days.

(21) Appl. No.: 10/629,753

(22) Filed: Jul. 30, 2003

(65) Prior Publication Data

US 2004/0125686 A1 Jul. 1, 2004

(30) Foreign Application Priority Data

Dec. 30, 2002 (KR) .............................. 10-2002-0086703

(51) Int. Cl.$^7$ .............................................. G11C 7/00
(52) U.S. Cl. .................. 365/201; 365/189.09; 365/193
(58) Field of Search ............ 365/201, 189.05, 365/189.08, 233, 189.09, 193, 230.08

(56) References Cited

U.S. PATENT DOCUMENTS

| | | | | |
|---|---|---|---|---|
| 5,825,710 A | * | 10/1998 | Jeng et al. | ............. 365/230.03 |
| 6,009,036 A | * | 12/1999 | Takasugi | ............... 365/230.01 |
| 6,069,829 A | * | 5/2000 | Komai et al. | ................ 365/201 |
| 6,078,637 A | | 6/2000 | Ansel et al. | |
| 6,445,642 B2 | * | 9/2002 | Murakami | ................... 365/233 |
| 6,617,842 B2 | * | 9/2003 | Nishikawa et al. | ...... 324/158.1 |
| 2002/0184578 A1 | | 12/2002 | Yoshizawa | |

FOREIGN PATENT DOCUMENTS

| | | |
|---|---|---|
| JP | 6-267293 | 7/1994 |
| JP | 11-219599 | 8/1999 |
| JP | 11-339469 | 12/1999 |
| JP | 2002-270000 | 9/2002 |
| JP | 2002-358797 | 12/2002 |

* cited by examiner

*Primary Examiner*—Richard Elms
*Assistant Examiner*—Hien Nguyen
(74) *Attorney, Agent, or Firm*—Heller Ehrman LLP

(57) ABSTRACT

A dynamic random access memory (DRAM) features an address counter strobe test mode device including a reference pulse generator, an address counter strobe test mode unit, an internal address counter unit, and an address decoding unit. The reference pulse generator receives an external clock signal and generates an internal clock signal. The address counter strobe test mode unit receives the internal clock signal and outputs an address strobe signal, wherein a pulse width and a pulse generating time of the address strobe signal are regulated in response to a plurality of control signals outputted from a mode register set. The internal address counter unit receives an external address signal and outputs an internal address signal in response to the address strobe signal. The address decoding unit decodes the internal address signal. As a result, the address counter strobe test mode device prevents mis-operations caused by mis-addressing in the DRAM.

20 Claims, 5 Drawing Sheets

ADDRESS COUNTER STROBE TEST MODE DEVICE

BACKGROUND OF THE INVENTION

1. Field of the Invention

The present invention relates to a test mode device for monitoring an operation of an internal address counter, and more specifically, to a technique for regulating a pulse width and a pulse generating time of an address strobe signal to cope with a column fail of the dynamic random access memory (DRAM).

2. Description of the Prior Art

As the operating speed (e.g., clock frequency) of a DRAM increases above a threshold, operations that receive a command signal or an address signal inputted externally frequently fail.

Generally, when an external clock signal of a DRAM transitions, an internal clock signal generated by the external clock signal also transitions. However, as the clock speed tCK (frequency) of the DRAM becomes higher, the internal clock signal does not transition at the same time the external clock signal transitions. As a result, the DRAM does not receive an external address properly. This event is called a column fail.

Conventionally, a method for regulating a pulse width of an internal clock signal CLKP4 generated by an external clock signal CLK is used in order to solve the column fail problem.

An address strobe signal EXTYP8 and a read/write strobe signal are generated from a pulse signal of the internal clock signal CLKP4.

As a result, if the pulse width of the internal clock signal CLKP4 is regulated in order to adjust the pulse width of the address strobe signal EXTYP8, the pulse width of the read/write strobe signal is also adjusted.

If the pulse width of the address strobe signal EXTYP8 is regulated, the pulse widths of relevant signals are simultaneously changed. As a result, there is a limit to the improvement of DRAM performance achievable using this conventional method.

FIG. 1 is a timing diagram illustrating the mis-operation of a conventional address counter circuit. If a pulse width of an internal clock signal changes, a pulse width of the address strobe signal EXTYP8 is also adjusted, which results in the mis-operation of the conventional address counter circuit.

As shown in FIG. 1, if an external clock signal CLK is inputted, an internal clock signal CLKP4 is generated by the external clock signal CLK, and then an address strobe signal EXTYP8 is generated. Internal addresses ADD_EV<1> and ADD_OD<1> are generated by the address strobe signal EXTYP8. Here, the regulated pulse width of the internal clock signal CLK is also applied to the address strobe signal EXTYP8.

After an external address signal ADD<0> transitions from a high to a low level, the address strobe signal EXTYP8 having the longer pulse width is maintained at a high level for a predetermined time and then transitions to a low level.

Though the external address signal ADD<0> and the address strobe signal EXTYP8 are required to be within a cycle of the external clock signal CLK, they are out of cycle with the external clock signal CLK because the pulse width of the address strobe signal EXTYP8 is lengthened.

As a result, the address strobe signal EXTYP8 is maintained at the high level for a predetermined time (A, B, C) and transitions to the low level after the external address signal ADD<0> transitions from the high to low level.

For the predetermined time (A, B, C), the DRAM accesses a wrong address, thereby generating a mis-operation.

SUMMARY OF THE INVENTION

Accordingly, it is an object of the present invention to provide an address counter strobe test mode device configured to regulate a pulse width and a pulse generating time of an address strobe signal to prevent a column fail.

In an embodiment, there is an address counter strobe test mode device comprising a reference pulse generator, an address counter strobe test mode unit, an internal address counter unit, and an address decoding unit. The reference pulse generator receives an external clock signal and generates an internal clock signal. The address counter strobe test mode unit receives the internal clock signal and outputs an address strobe signal, wherein a pulse width and a pulse generating time of the address strobe signal are regulated in response to a plurality of control signals outputted from a mode register set. The internal address counter unit receives an external address signal and outputs an internal address signal in response to the address strobe signal. The address decoding unit decodes the internal address signal.

DETAILED DESCRIPTION OF THE PREFERRED EMBODIMENTS

The present invention will be described in detail with reference to the attached drawings.

Figure 1:
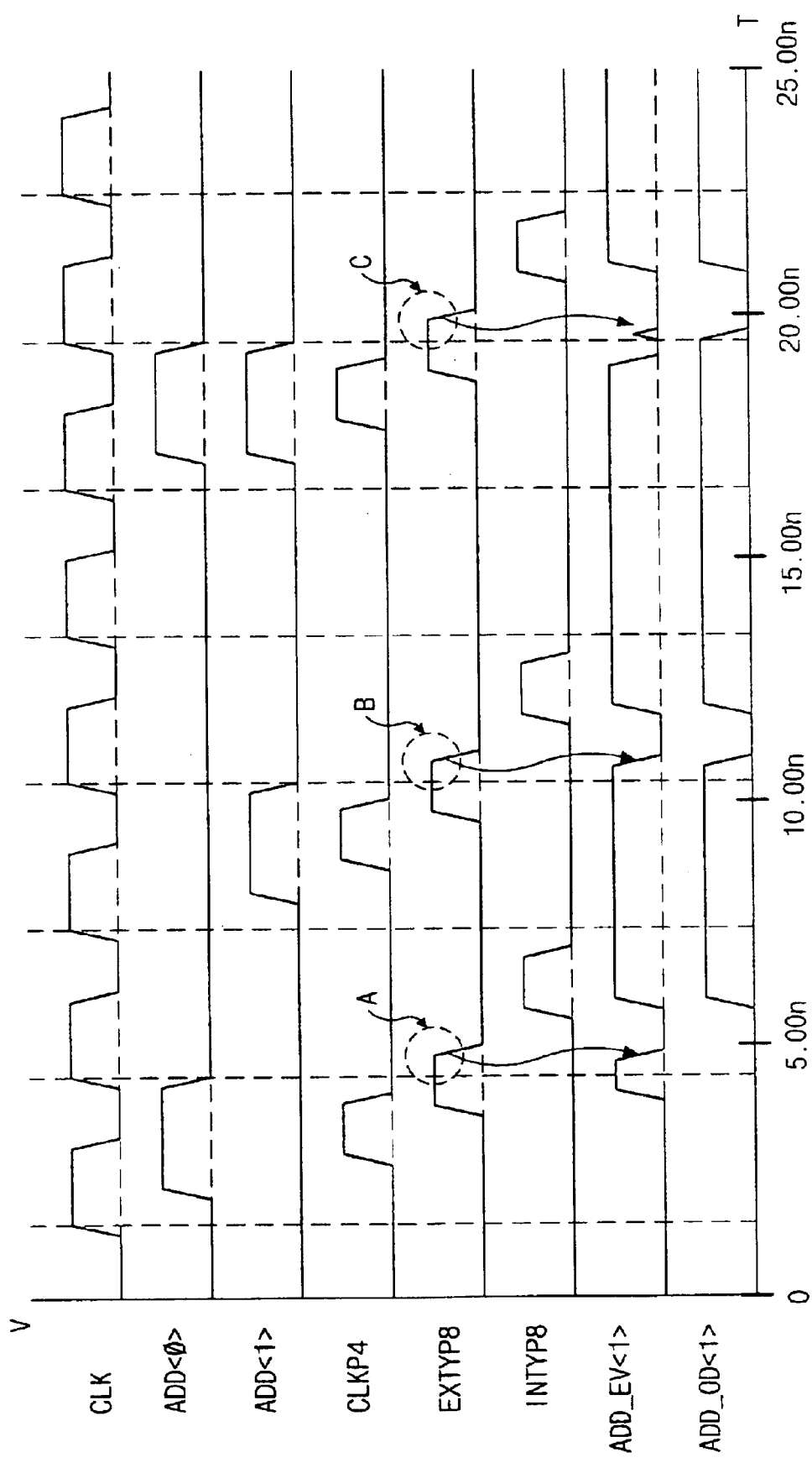
FIG. 1 is a timing diagram illustrating a mis-operation of a conventional address counter circuit.
Figure 2:
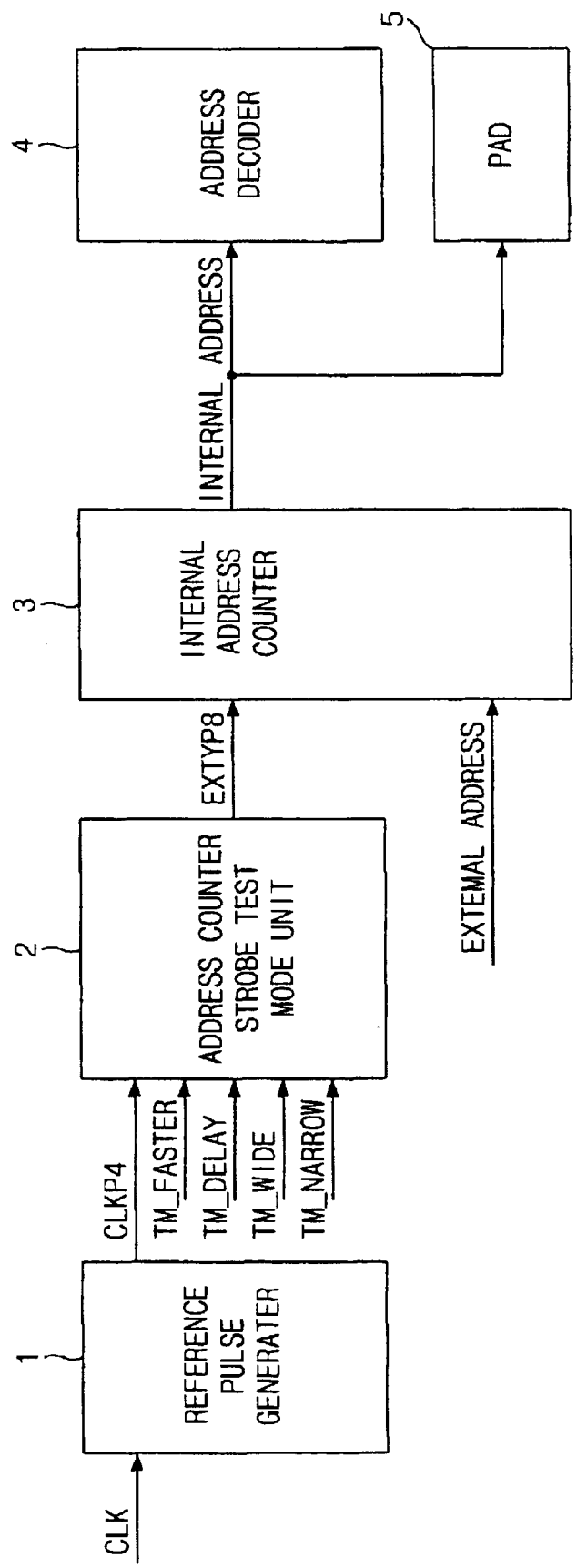
FIG. 2 is a block diagram illustrating an address counter strobe test mode device according to an embodiment of the present invention.

FIG. 2 is a block diagram illustrating an address counter strobe test mode device according to an embodiment of the present invention.

In this embodiment, the address counter strobe test mode circuit comprises a reference pulse generator 1, an address counter strobe test mode unit 2, an internal address counter 3, an address decoder 4, and a pad 5.

The reference pulse generator 1 receives an external clock signal CLK, and outputs an internal clock signal CLKP4.

The address counter strobe test mode unit 2 receives the internal clock signal CLKP4 from the reference pulse generator 1, and control signals TM_FASTER, TM_DELAY, TM_WIDE and TM_NARROW from a mode register set (MRS). Then, the address counter strobe test mode unit 2 outputs an address strobe signal EXTYP8 of which a pulse width and a pulse generating time are regulated depending on the control signals TM_FASTER, TM_DELAY, TM_WIDE and TM_NARROW.

The internal address counter 3 receives external address signals ADD<0> and ADD<1> externally, and the address strobe signal EXTYP8 outputted from the address counter strobe test mode unit 2, and outputs internal address signals ADD_EV<1> and ADD_OD<1>.

The address decoder 4 receives the internal address signals ADD_EV<1> and ADD_OD<1> to decode the internal address signals. A user judges a normal operation of the circuit by monitoring the internal address signals ADD_EV<1> and ADD_OD<1> externally by using the pad 5.

Figure 3:
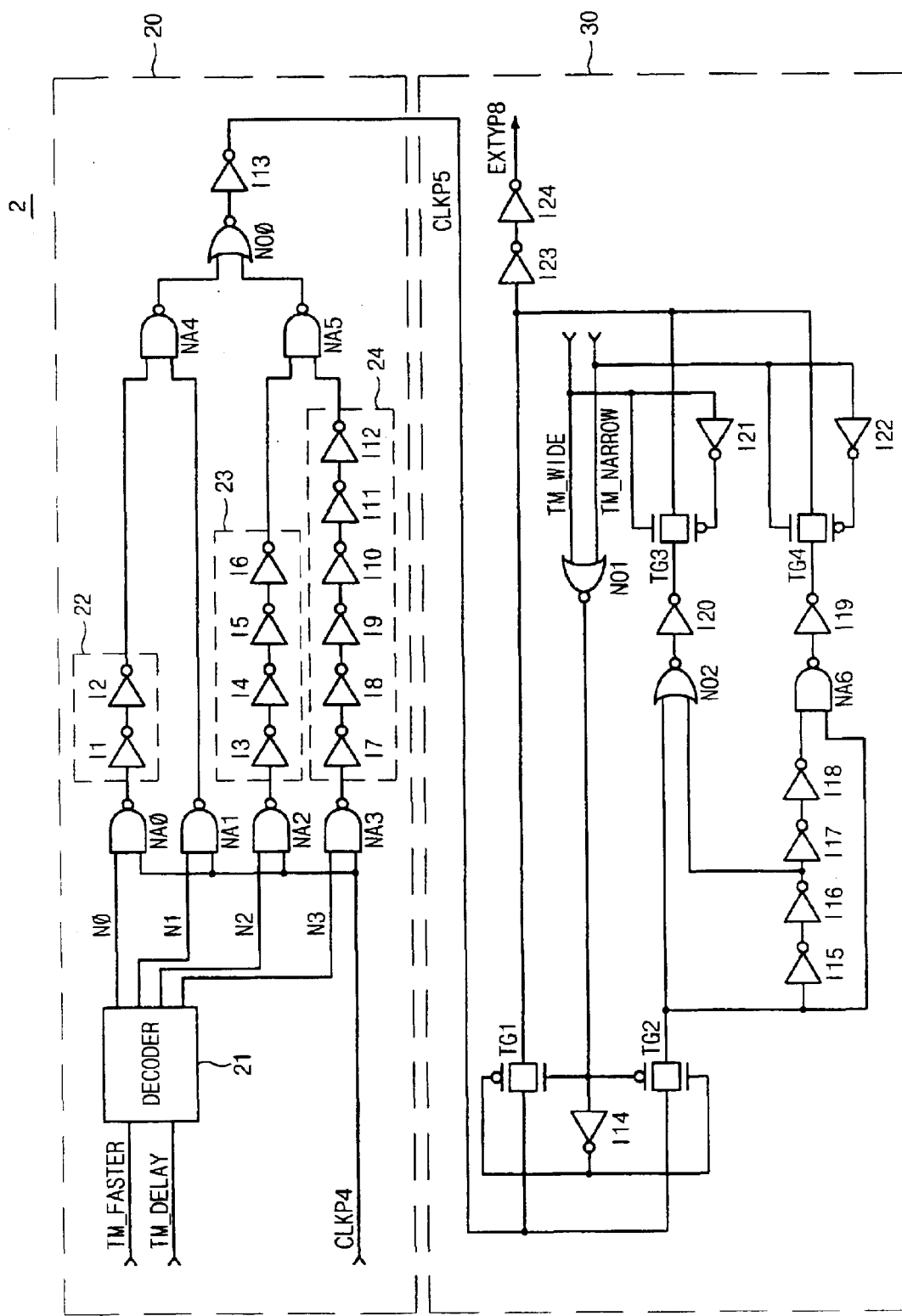
FIG. 3 is a circuit diagram illustrating an address counter strobe test mode unit of FIG. 2.

FIG. 3 is a detailed circuit diagram illustrating an embodiment of the address counter strobe test mode unit 2 of FIG. 2.

The address counter strobe test mode unit 2 outputs the address strobe signal EXTYP8 of which a pulse width and a pulse generating time are regulated depending on the control signals TM_FASTER, TM_DELAY, TM_WIDE and TM_NARROW. Here, the control signals TM_FASTER, TM_DELAY, TM_WIDE and TM_NARROW are outputted from the MRS of the DRAM.

In an embodiment illustrated in FIG. 3, the address counter strobe test mode unit 2 comprises a pulse generating time controller 20 for regulating a pulse generating time of the internal clock signal CLKP4 and a pulse width controller 30 for regulating a pulse width of the internal clock signal CLKP4.

According to a particular embodiment illustrated in FIG. 3, the pulse generating time controller 20 comprises a decoder 21, NAND gates NA0~NA5, delay units 22, 23 and 24, an inverter I13, and a NOR gate NO0. The pulse generating time controller 20 delays the internal clock signal CLKP4 received from the reference pulse generator 1 of FIG. 2 in response to the control signals TM_FASTER and TM_DELAY, and outputs an intermediate clock signal CLKP5.

The decoder 21 decodes the control signals TM_FASTER and TM_DELAY, and outputs four signals into nodes N0~N3, respectively. The NAND gates NA0~NA3 perform NAND operations on the four output signals from the decoder 21 and the internal clock signal CLKP4.

Specifically, the NAND gate NA0 performs the NAND operation on an output signal from the node N0 and the internal clock signal CLKP4, and outputs to the NAND operation result to the delay unit 22. Here, the delay unit 22 comprises inverters I1 and I2.

The NAND gate NA1 performs the NAND operation on an output signal from the node N1 and the internal clock signal CLKP4, and outputs the NAND operation result without delay.

The NAND gate NA2 performs the NAND operation on an output signal from the node N2 and the internal clock signal CLKP4, and outputs the NAND operation result into the delay unit 23. Here, the delay unit 23, comprising inverters I3~I6, has a longer delay time than the delay unit 22.

The NAND gate NA3 performs the NAND operation on an output signal from the node N3 and the internal clock signal CLKP4, and outputs the NAND operation result into the delay unit 24. Here, the delay unit 24, comprising inverters I7~I12, has a longer delay time than the delay unit 23. In this way, each delay unit 22, 23 and 24 can control the delay time depending on the number of inverters in each unit.

The NAND gate NA4 performs the NAND operation on the output signal from the NAND gate NA1 and an output signal from the delay unit 22. The NAND gate NA5 performs the NAND operation on output signals from the delay units 23 and 24, and outputs the NAND operation result.

The NOR gate NO0 performs a NOR operation on output signals from the NAND gates NA4 and NA5, and outputs an intermediate clock signal CLKP5 through the inverter I13. The pulse generating time of the clock signal CLKP4 is controlled by the delay units 22, 23 and 24. The intermediate clock signal CLKP5 is a signal having the regulated pulse generating time of the clock signal CLKP4.

The following Table 1 shows the operation of the pulse generating time controller 20 according to an embodiment of the invention.

TABLE 1

Truth table of the pulse generating time controller

| TM_FASTER | TM_DELAY | Selection node | Selection Logic means | Number of Inverters |
|---|---|---|---|---|
| L | L | N0 | NA0 | 2 |
| H | L | N1 | NA1 | x |
| L | H | N2 | NA2 | 4 |
| H | H | N3 | NA3 | 6 |

Table 1 shows the operation of controlling the pulse generating time depending on the logic states of the control signals TM_FASTER and TM_DELAY when the internal clock signal CLKP4 is enabled.

When the control signals TM_FASTER and TM_DELAY are all at a low level, the node N0 is set at a high level. As a result, the internal clock signal CLKP4 received from the NAND gate NA0 is delayed for a delay time of the inverters I1 and I2 in the delay unit 22. When the control signal TM_FASTER is at the high level and the control signal TM_DELAY is at the low level, the node N1 is set at a high level. As a result, the internal clock signal CLKP4 received from the NAND gate NA1 is outputted into the NAND gate NA4 without delay.

When the control signal TM_FASTER is at the low level and the control signal TM_DELAY is at the high level, the node N2 is set at a high level. As a result, the internal clock signal CLKP4 received from the NAND gate NA2 is delayed for a delay time of the inverters I3~I6 in the delay unit 23. Here, the delay time of the inverters I3~I6 is longer than that of the inverters I1 and I2.

When the control signals TM_FASTER and TM_DELAY are all at the high level, the node N3 is set at a high level. As a result, the internal clock signal CLKP4 received from the NAND gate NA3 is delayed for a delay time of the inverters I7~I12 in the delay unit 24. Here, the delay time of the delay unit 24 is longer than that of the delay unit 23.

In this way, the pulse generating time controller 20 controls the pulse generating time of the internal clock signal CLKP4 depending on the logic states of the control signals TM_FASTER and TM_DELAY.

According to a particular embodiment illustrated in FIG. 3, the pulse width controller 30 comprises NOR gates NO1 and NO2, inverters I14~I24, transmission gates TG1~TG4, and a NAND gate NA6. The pulse width controller 30 controls the pulse width of the intermediate clock signal CLKP5 depending on the control signals TM_WIDE and TM_NARROW.

Accordingly, according to an embodiment of the invention, the pulse generating time controller 20 and the pulse width controller 30 regulate the pulse generating time and the pulse width of the clock signal CLKP4 to output the address strobe signal EXTYP8.

The NOR gate NO1 performs the NOR operation on the control signals TM_WIDE and TM_NARROW. The transmission gates TG1 and TG2 transmits the intermediate clock signal CLKP5 in response to an output signal from the NOR gate NO1.

The NOR gate NO2 performs the NOR operation on a non-delayed output signal from the transmission gate TG2 and a signal delayed by the inverters I15 and I16. An output signal from the NOR gate NO2 is inverted by the inverter I20, and transmitted into the transmission gate TG3. Here, the transmission gate TG3 is controlled by the control signal TM_WIDE.

The NAND gate NA6 performs the NAND operation on the non-delayed output signal from the transmission gate TG2 and a signal delayed by the inverters I15~I18. An output signal from the NAND gate NA6 is inverted by the inverter I19, and transmitted into the transmission gate TG4. Here, the transmission gate TG4 is controlled by the control signal TM_NARROW.

Output signals from the transmission gates TG1, TG3 and TG4 are delayed by the inverters I23 and I24, and outputted as the address strobe signal EXTYP8.

TABLE 2

Truth table of the transmission gate

| TM_WIDE | TM_NARROW | Selection transmission gate |
|---------|-----------|------------------------------|
| L | L | TG1 |
| H | L | TG2, TG3 |
| L | H | TG2, TG4 |
| H | H | TG2, TG3, TG4 |

Table 2 shows the operation of the transmission gates depending on the logic states of the control signals TM_WIDE and TM_NARROW.

When the control signals TM_WIDE and TM_NARROW are all at a low level, the transmission gate TG1 operates to output the address strobe signal EXTYP8 without regulating the pulse width of the intermediate clock signal CLKP5.

When the control signal TM_WIDE is at the high level and the control signal TM_NARROW is at the low level, the transmission gates TG2 and TG3 are driven. The NOR gate NO2 performs the NOR operation on the non-delayed intermediate clock signal CLKP5 and the delayed intermediate clock signal CLKP5 delayed by the inverters I15 and I16 to widen the pulse width of the intermediate clock signal CLKP5. As a result, the pulse width of the address strobe signal EXTYP8 as an output signal becomes wide.

When the control signal TM_WIDE is at the low level and the control signal TM_NARROW is at the high level, the transmission gates TG2 and TG4 are driven and the intermediate clock signal CLKP5 is transmitted through the transmission gate TG2. The NAND gate NA6 performs the NAND operation on the non-delayed intermediate clock signal CLKP5 and the delayed intermediate clock signal CLKP5 by the inverters I15~I18 to reduce the pulse width of the intermediate clock signal CLKP5. As a result, the pulse width of the address strobe signal EXTYP8 as an output signal becomes narrow.

When the control signals TM_WIDE and TM_NARROW are all at the high level, the transmission gates TG2, TG3 and TG4 operate. As a result, the pulse width of the intermediate clock signal CLKP5 becomes wide and narrow at the same time, and the address strobe signal EXTYP8 is outputted without regulation of the pulse width.

In this way, the address strobe signal EXTYP8 is a signal obtained by regulating the pulse width and the pulse generating time of the internal clock signal CLKP4.

Figure 4:
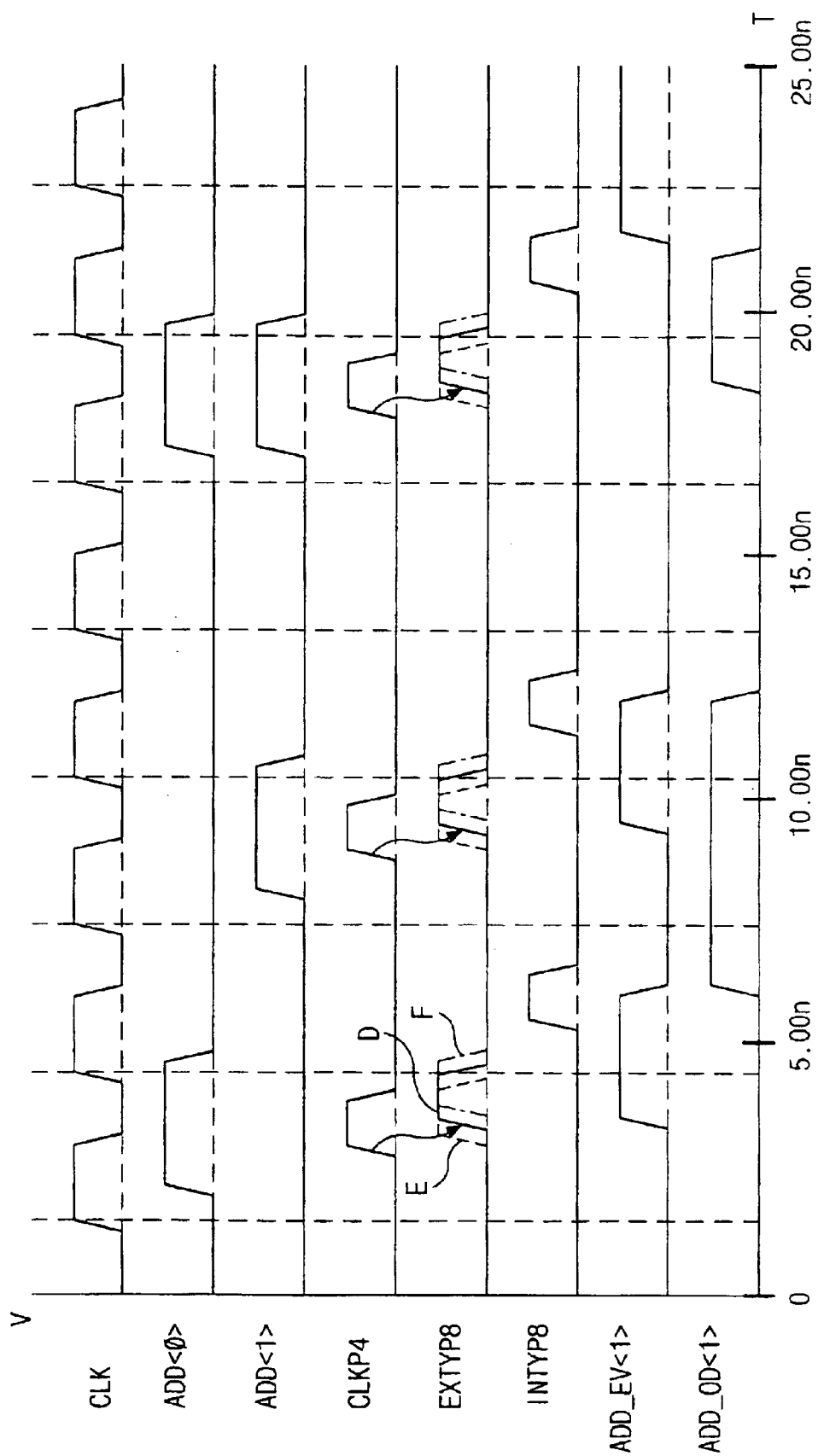
FIG. 4 is a timing diagram illustrating the operation of the address counter strobe test mode unit of FIG. 3 when the address strobe pulse generating time is regulated.

FIG. 4 is a timing diagram illustrating the operation of the address counter strobe test mode unit of the embodiment illustrated in FIG. 3 when the address strobe pulse generating time is regulated.

Since the external clock signal CLK has a predetermined clock, the external address signals ADD<0> and ADD<L> have a predetermined clock, respectively. If the internal clock signal CLKP4 is enabled, the address strobe signal EXTYP8 is enabled.

The solid line D shows the waveform of the normal address strobe signal EXTYP8 passed through the delay unit 22 when the control signals TM_FASTER and TM_DELAY of FIG. 3 are all at the low level.

The broken line E shows the waveform of the address strobe signal EXTYP8 when the control signal TM_FASTER is at the high level and the control signal TM_DELAY is at the low level. In this case, the address strobe signal EXTYP8 is generated earlier than in the normal state D because it does not pass through any delay unit.

The dash-dot line F shows the waveform of the address strobe signal EXTYP8 when the control signal TM_FASTER is at the low level and the control signal TM_DELAY is at the high level. In this case, the address strobe signal EXTYP8 is generated later than in the normal state D because it passes through delay unit 23.

Figure 5:
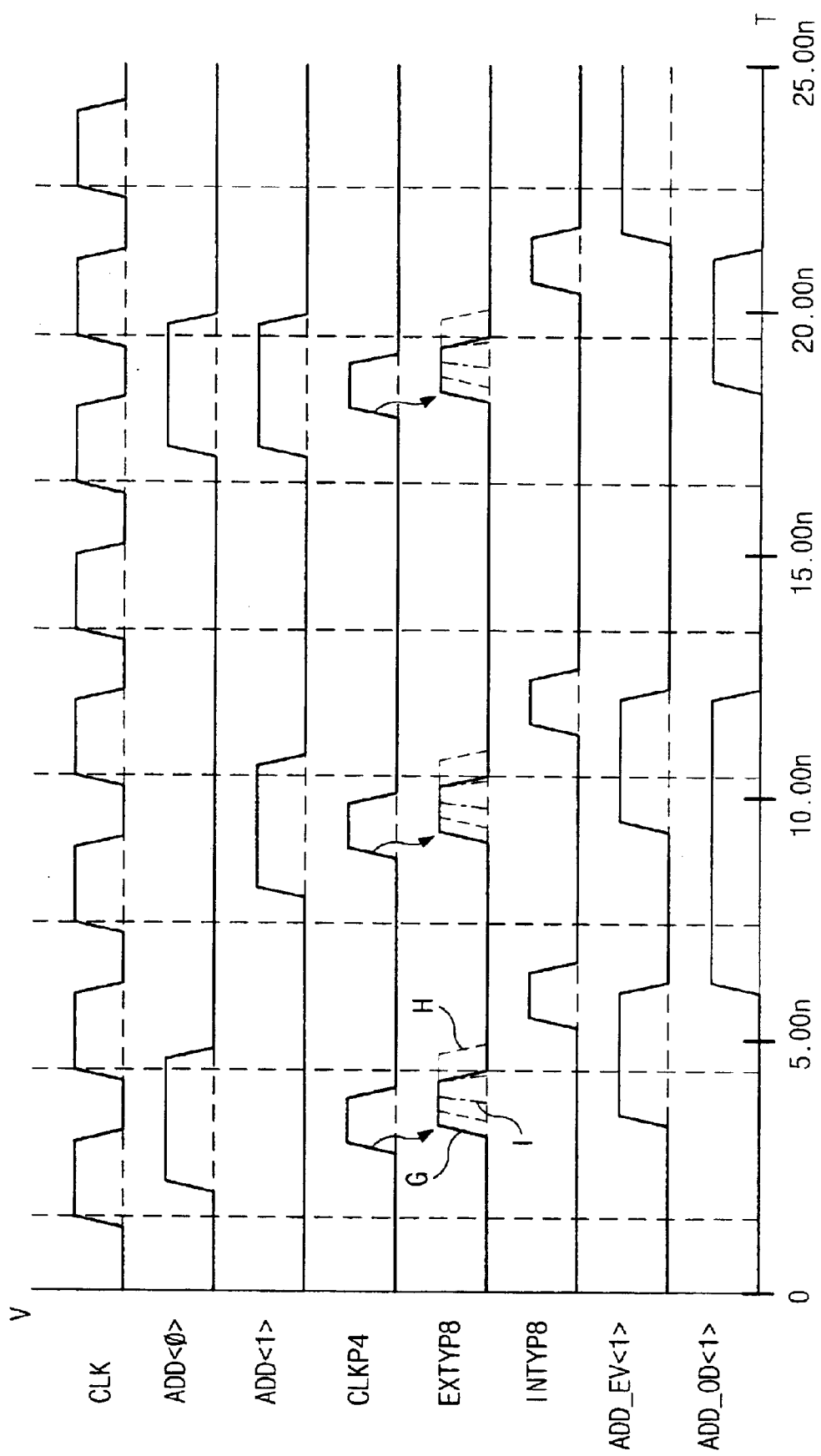
FIG. 5 is a timing diagram illustrating the operation of the address counter strobe test mode unit of FIG. 3 when the address strobe pulse width is regulated.

FIG. 5 is a timing diagram illustrating the operation of the address counter strobe test mode unit of the embodiment illustrated in FIG. 3 when the address strobe pulse width is regulated.

If the internal clock signal CLKP4 is enabled, the address strobe signal EXTYP8 is enabled.

The solid line G shows the waveform of the normal address strobe signal EXTYP8 when the control signals TM_WIDE and TM_NARROW of FIG. 3 are all at the low level. Here, the pulse width of the address strobe signal EXTYP8 is not regulated.

The broken line H shows the waveform of the address strobe signal EXTYP8 when the control signal TM_WIDE is at the high level and the control signal TM_NARROW is at the low level. Here, the pulse width of the address strobe signal EXTYP8 is regulated to become wide.

The dash-dot line I shows the waveform of the address strobe signal EXTYP8 when the control signal TM_WIDE is at the low level and the control signal TM_NARROW is at the high level. Here, the pulse width of the address strobe signal EXTYP8 is regulated to become narrow.

In this way, if the pulse width and the pulse generating time of the address strobe signal EXTYP8 are regulated, the mis-operation caused by mis-addressing in the DRAM can be prevented Accordingly, an address counter strobe test mode device according to an embodiment of the present invention can easily regulate a pulse width and a pulse generating time of the internal clock signal CLKP4 to prevent a mis-operation caused by mis-addressing in a DRAM operation.

While the present invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. An address counter strobe test mode device, comprising:
   a reference pulse generator means for receiving an external clock signal and generating an internal clock signal;
   an address counter strobe test mode means for receiving the internal clock signal and outputting an address strobe signal, wherein a pulse width and a pulse generating time of the address strobe signal are regulated in response to a plurality of received control signals;
   an internal address counter means for receiving an external address signal and outputting an internal address signal in response to the address strobe signal; and
   an address decoding means for decoding the internal address signal.

2. The address counter strobe test mode device according to claim 1, further comprising a pad coupled to the internal address counter means and disposed outside so that it is accessible for testing the internal address signal.

3. The device according to claim 1, wherein the address counter strobe test mode means comprises:
   a pulse generating time controller means for delaying the internal clock signal and controlling a pulse generating time in response to a first control signal and a second control signal of the plurality of control signals; and
   a pulse width controller means for controlling a pulse width of the internal clock signal in response to a third control signal and a fourth control signal of the plurality of control signals.

4. The device according to claim 3, wherein the pulse generating time controller means comprises:
   a decoder means for decoding the first control signal and the second control signal and outputting a plurality of output signals in response thereto;
   a plurality of logic operation means for logically operating the internal clock signal and the plurality of output signals from the decoder; and
   a plurality of delay unit means for delaying output signals from the logic operation means depending on states of the first control signal and the second control signal.

5. The device according to claim 4, further comprising a plurality of NAND operation means each for performing a NAND operation on output signals from the plurality of delay units, and a NOR gate configured to perform a NOR operation on NAND operation results.

6. The device according to claim 3, wherein the pulse width controller means comprises:
   a plurality of transmission gate means for transmitting the internal clock signal in response to the second control signal;
   a first logic means for narrowing a pulse width of the internal clock signal; and
   a second logic means for widening a pulse width of the internal clock signal.

7. An dynamic random access memory, comprising:
   a mode register set configured to generate a plurality of control signals;
   a reference pulse generator circuit configured to receive an external clock signal and generate an internal clock signal in response thereto;
   an address counter strobe test mode circuit configured to receive the internal clock signal and the plurality of received control signals and output an address strobe signal having a pulse width and a pulse transition time controlled in response to the plurality of received control signals;
   an internal address counter circuit configured to receive an external address signal and the address strobe signal and output an internal address signal in response thereto; and
   an address decoding circuit configured to receive and decode the internal address signal.

8. The dynamic random access memory according to claim 7, further comprising a pad coupled to the internal address counter circuit and disposed so that it is accessible for testing the internal address signal.

9. The dynamic random access memory according to claim 7, wherein the address counter strobe test mode circuit comprises:
   a pulse generating time controller circuit comprising logic and delay circuits configured to receive the internal clock signal and a first control signal and a second control signal of the plurality of control signals, and generate an intermediate clock signal delayed with respect to the internal clock signal depending on the received first and second control signals; and
   a pulse width controller circuit comprising logic and delay circuits configured to receive the intermediate clock signal and a third control signal and a fourth control signal of the plurality of control signals, and generate the address strobe signal having a pulse width determined in response to the third and fourth control signals.

10. The dynamic random access memory according to claim 9, wherein the pulse generating time controller circuit comprises:
    a decoder circuit configured to receive the first control signal and the second control signal, and output a plurality of decoder output signals in response thereto;
    a plurality of delay circuits each configured to receive the internal clock signal and output an associated clock signal having a predetermined delay, wherein each of the plurality of delay circuits has a different predetermined delay; and
    a plurality of logic circuits configured to receive the plurality of decoder output signals and, in response thereto, connect one of the plurality of delay circuits to the internal clock signal to generate the intermediate clock signal.

11. The dynamic random access memory according to claim 10, wherein the plurality of logic circuits comprises:
    a plurality of NAND gates each configured to receive two or more of the output clock signals from the plurality of delay circuits and generate a NAND output; and
    a NOR gate configured to receive two or more of the plurality of NAND outputs and generate a NOR output; and
    an inverter configured to receive the NOR output and output the intermediate clock signal.

12. The dynamic random access memory according to claim 10, wherein the plurality of logic circuits comprise NAND gates.

13. The dynamic random access memory according to claim 10, wherein the plurality of delay circuits each comprises a number of inverters configured to delay the associated clock signal depending on the number of inverters in the delay circuit.

14. The dynamic random access memory according to claim 13, wherein the plurality of delay circuits comprises four delay circuits that comprise zero, two, four and six inverters respectively.

15. The dynamic random access memory according to claim 9, wherein the pulse width controller circuit comprises:
   a plurality of transmission gates configured to receive the intermediate clock signal and the second control signal and transmit the intermediate clock signal in response to the second control signal;
   a first logic circuit configured to narrow the pulse width of the internal clock signal; and
   a second logic circuit configured to for widen the pulse width of the internal clock signal.

16. The dynamic random access memory according to claim 15, wherein the first logic circuit comprises a NAND gate.

17. The dynamic random access memory according to claim 15, wherein the second logic circuit comprises a NOR gate.

18. A dynamic random access memory, comprising:
   a reference pulse generating means for receiving an external clock signal having a frequency and generating an internal clock signal; and
   an internal address generating means for receiving the internal clock signal and outputting an address strobe signal, wherein a pulse width and a pulse generating time of the address strobe signal are regulated in response to a plurality of received control signals, and for generating an internal address signal in response to the address strobe signal.

19. The dynamic random access memory according to claim 18, wherein the internal address generating means comprises:
   an address counter strobe test mode unit configured to receive the internal clock signal and the plurality of received control signals and output the address strobe signal having the pulse width and the pulse generating time controlled in response to the plurality of received control signals; and
   an internal address counter configured to receive an external address signal and the address strobe signal and output the internal address signal in response thereto.

20. The dynamic random access memory according to claim 19, wherein the address counter strobe test mode unit comprises:
   a pulse generating time controller comprising logic and delay circuits configured to receive the internal clock signal and a first control signal and a second control signal of the plurality of control signals, and generate an intermediate clock signal delayed with respect to the internal clock signal depending on the received first and second control signals; and
   a pulse width controller comprising logic and delay circuits configured to receive the intermediate clock signal and a third control signal and a fourth control signal of the plurality of control signals, and generate the address strobe signal having a pulse width determined in response to the third and fourth control signals.

* * * * *